(12) United States Patent
Kim et al.

(10) Patent No.: US 7,696,046 B2
(45) Date of Patent: Apr. 13, 2010

(54) METHOD OF MANUFACTURING A SEMICONDUCTOR DEVICE HAVING A MULTI-CHANNEL TYPE MOS TRANSISTOR

(75) Inventors: Min-Sang Kim, Seoul (KR); Sung-Young Lee, Gyeonggi-do (KR); Sung-Min Kim, Incheon (KR); Eun-Jung Yun, Seoul (KR); In-Hyuk Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 217 days.

(21) Appl. No.: 11/876,613

(22) Filed: Oct. 22, 2007

(65) Prior Publication Data

US 2008/0099849 A1 May 1, 2008

(30) Foreign Application Priority Data

Oct. 30, 2006  (KR) ...................... 10-2006-0105459

(51) Int. Cl.
*H01L 21/336* (2006.01)
*H01L 21/20* (2006.01)
*H01L 21/31* (2006.01)
*H01L 21/469* (2006.01)

(52) U.S. Cl. .................. 438/270; 438/386; 438/768; 257/E21.209; 257/E21.24; 257/E21.41; 257/E29.264

(58) Field of Classification Search .............. 438/270, 438/386, 593, 768; 257/E21.008, E21.209, 257/E21.24, E21.41, E29.264

See application file for complete search history.

(56) References Cited

U.S. PATENT DOCUMENTS

| 4,996,574 | A | 2/1991 | Shirasaki |
| 6,413,802 | B1 | 7/2002 | Hu et al. |
| 7,229,884 | B2 * | 6/2007 | Park ........................ 438/289 |
| 7,615,429 | B2 * | 11/2009 | Kim et al. .................. 438/197 |
| 2004/0063286 | A1 * | 4/2004 | Kim et al. .................. 438/283 |
| 2004/0209463 | A1 * | 10/2004 | Kim et al. .................. 438/666 |

(Continued)

FOREIGN PATENT DOCUMENTS

KR    2005-0089315    9/2005

OTHER PUBLICATIONS

English language abstract of Korean Publication No. 2005-0089315.

*Primary Examiner*—David S Blum
(74) *Attorney, Agent, or Firm*—Harness, Dickey & Pierce

(57) ABSTRACT

In a method of manufacturing a semiconductor device, an active channel pattern is formed on a substrate. The active channel pattern includes preliminary gate patterns and single crystalline silicon patterns that are alternately stacked with each other. A source/drain layer is formed on a sidewall of the active channel pattern. Mask pattern structures including a gate trench are formed on the active channel pattern and the source/drain layer. The patterns are selectively etched to form tunnels. The gate trench is then filled with a gate electrode. The gate electrode surrounds the active channel pattern. The gate electrode is protruded from the active channel pattern. The mask pattern structures are then removed. Impurities are implanted into the source/drain regions to form source/drain regions. A silicidation process is carried out on the source/drain regions to form a metal silicide layer, thereby completing a semiconductor device having a MOS transistor.

20 Claims, 12 Drawing Sheets

U.S. PATENT DOCUMENTS

| | | |
|---|---|---|
| 2004/0227181 A1 | 11/2004 | Yeo et al. |
| 2006/0131666 A1 | 6/2006 | Li et al. |
| 2006/0234450 A1* | 10/2006 | Forbes et al. ............... 438/257 |
| 2007/0196973 A1* | 8/2007 | Park .......................... 438/197 |
| 2008/0093628 A1* | 4/2008 | Lee et al. .................... 257/190 |

* cited by examiner

METHOD OF MANUFACTURING A SEMICONDUCTOR DEVICE HAVING A MULTI-CHANNEL TYPE MOS TRANSISTOR

CROSS-REFERENCE TO RELATED APPLICATION

This application claims priority under 35 USC §119 to Korean Patent Application No. 2006-105459 filed on Oct. 30, 2006, the contents of which are herein incorporated by reference in their entirety for all purposes.

BACKGROUND

1. Technical Field

Example embodiments of the present invention relate to a method of manufacturing a semiconductor device. More particularly, example embodiments of the present invention relate to a semiconductor device having multiple channels and a method of manufacturing a semiconductor device including a MOS transistor that has multiple channels.

2. Description of the Related Art

As semiconductor devices have been highly integrated, a size of a region where devices are formed, i.e., an active region may be reduced. Further, a channel length of a metal-oxide-semiconductor (MOS) transistor in the active region may be shortened. When the channel length of the MOS transistor is short, source/drain regions may greatly affect an electric field and/or an electric potential in the channel region. This phenomenon may be referred to as a short channel effect.

Therefore, various methods of reducing sizes of devices on a semiconductor substrate, and also methods of improving capacities thereof have been widely researched. A conventional example of the methods may include a vertical transistor such as a fin structure, a fully depleted lean-channel transistor (DELTA) structure, a gate-all-around (GAA) structure, etc.

For example, U.S. Pat. No. 6,413,802 discloses a fin-type MOS transistor that includes a plurality of thin channel fins that are in parallel with each other and arranged between source/drain regions, and a gate electrode expanding along an upper face and sidewalls of the channel fins. According to the fin-type MOS transistor, since the gate electrode is formed on both sidewalls of the channel fins, the gate electrode may be controlled from the sidewalls so that the short channel effect may be decreased. However, because the channel fins of the fin-type MOS transistor are arranged in parallel with a widthwise direction of the gate electrode, areas of channel regions and the source/drain regions may become greater. Further, a junction capacitance of the source/drain regions may be increased due to a number of the channels.

U.S. Pat. No. 4,996,574 discloses a MOS transistor having the DELTA structure. In the MOS transistor having the DELTA structure, an active layer as a channel may have a uniform width and a vertically protruded channel region. Further, a gate electrode may surround the vertically protruded channel region. Thus, a height of the protruded channel region may correspond to a width of the channel, and a width of the protruded channel region may correspond to a thickness of the channel. Since both sidewalls of the protruded channel region may be used together, the channel width may increase twice as much. Furthermore, when the width of the protruded channel region is reduced, depletion layers of the channel at both sidewalls may be overlapped with each other to increase an electrical conductivity of the channel.

However, when the MOS transistor having the DELTA structure is formed on a bulk silicon substrate, a substrate may be oxidized when forming a protruded portion at a surface of the substrate where the channel is to be formed, and covering the protruded portion with an anti-oxidation layer. Here, when the oxidation process is carried out, a portion between the protruded portion and the substrate, which is not covered with the anti-oxidation layer, may be oxidized by laterally diffusing oxygen so that the channel may be isolated from the substrate. The excessive oxidation may cause the channel isolation and reduce a thickness of the channel adjacent to the portion between the protruded portion and the substrate. Further, a single crystalline layer in the portion between the protruded portion and the substrate may be damaged by stresses generated in the oxidation process.

In contrast, when the MOS transistor having the DELTA structure is formed on a silicon-on-insulator (SOI) substrate, an SOI layer may be etched to provide the etched SOI layer with a narrow width, thereby forming a channel region. Thus, the above-mentioned problems caused by the excessive oxidation of the bulk substrate may not be generated. However, a width of the channel may be restricted by a thickness of the SOI layer in the SOI substrate. Since the SOI layer in a full depletion type SOI substrate may have hundreds of angstroms of thickness, applications of the SOI substrate may be very limited.

In the MOS transistor having the GAA structure, an active channel pattern as an SOI layer may be formed on a substrate. A gate electrode may surround a channel region of the active channel pattern covered with a gate insulation layer. Thus, effects substantially similar to those of the DELTA structure may be obtained.

However, to embody the GAA structure, a buried oxide layer under the active channel pattern may be etched using an undercut of an isotropic etching process to surround the active channel pattern in the channel region with the gate electrode. Here, since the SOI layer may be used for the channel region and source/drain regions, most lower portions of the source/drain regions as well as a lower portion of the channel region may be removed by the isotropic etching process. Therefore, when a conductive layer for the gate electrode is formed, the gate electrode may be formed at the lower portions of the source/drain regions as well as the channel region so that a parasitic capacitance may be increased.

Further, the lower portion of the channel region may be horizontally etched during the isotropic etching process. As a result, a horizontal length or a width of a tunnel with which the gate electrode is filled during a subsequent process may be lengthened. Thus, it may be difficult to manufacture the MOS transistor having the gate length shorter than the channel width. Further, there may be limitations to shortening the gate length.

A multi-bridge-channel MOS transistor has been developed as an alternative plan for overcoming the above-mentioned limits. The multi-bridge-channel MOS transistor may be manufactured by forming an active channel pattern that includes tunnels penetrating between channels, surrounding the channels with a gate electrode to thereby fill up the channels, and forming source/drain regions connected to the channels. Thus, although the number of the channels is various, the source/drain regions may have a uniform junction capacitance so that the multi-bridge-channel MOS transistor may have an improved integration degree and high speed.

However, in the multi-bridge-channel MOS transistor, a mask pattern structure, which may be used as a mold pattern for forming the gate electrode, may not be removed after forming the gate electrode. The remaining mask pattern structure may be used as a portion of an insulation interlayer. Therefore, it may be difficult to perform a silicidation process for reducing resistances of the source/drain regions on the source/drain regions. Further, since a process for forming the source/drain regions by implanting ions into the source/drain regions may be carried out before forming the mask pattern structure, the ions in the source/drain regions may have a heat budget that may induce a thermal diffusion of the ions by heat during formation of the gate electrode. As a result, the thermal diffusion of the ions may result in a short channel length between the source/drain regions so that an electrical short between the source/drain regions under a lowermost layer of the gate may be generated.

SUMMARY

Example embodiments of the present invention provide a method of manufacturing a multi-channel type semiconductor device that includes source/drain regions having a low thermal diffusion and a low resistance.

In a method of manufacturing a semiconductor device having multi-channels in accordance with one aspect of the present invention, an active channel pattern is formed on a substrate. Here, the active channel pattern includes a preliminary gate patterns and single crystalline silicon patterns that are alternately stacked with each other. Silicon grows from a sidewall of the active channel pattern to form a source/drain layer. Mask pattern structures including a gate trench are formed on the active channel pattern and the source/drain layer. The patterns for forming the gate are selectively etched to form a plurality of tunnels. The gate trench between the plurality of tunnels and the mask pattern structures is then filled with a gate electrode. Here, the gate electrode surrounds the active channel pattern. Further, the gate electrode is protruded from an upper face of the active channel pattern. The mask pattern structures are then removed. Impurities are implanted into the source/drain regions to form source/drain regions, thereby completing the semiconductor device having the multi-channels.

BRIEF DESCRIPTION OF THE DRAWINGS

The above and other features and advantages of the invention will become readily apparent by reference to the following detailed description when considered in conjunction with the accompanying drawings, wherein.

DETAILED DESCRIPTION

Figure 1A:
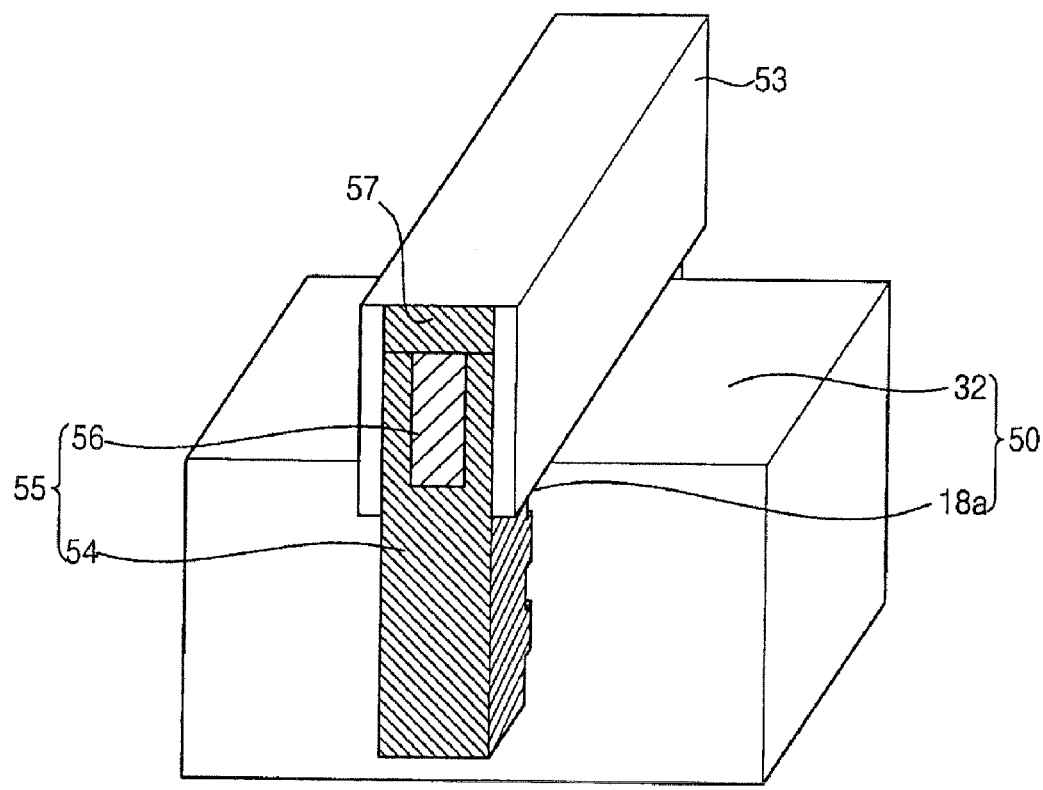
FIG. 1A is a perspective view illustrating a gate electrode of a MOS transistor having multi-channels in accordance with an example embodiment of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
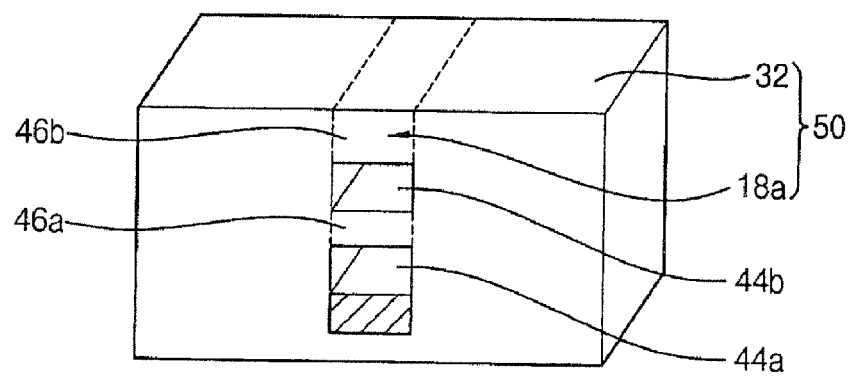
FIG. 1B is a perspective view illustrating an active channel pattern of the MOS transistor having the multi-channels in FIG. 1A.
Figure 2:
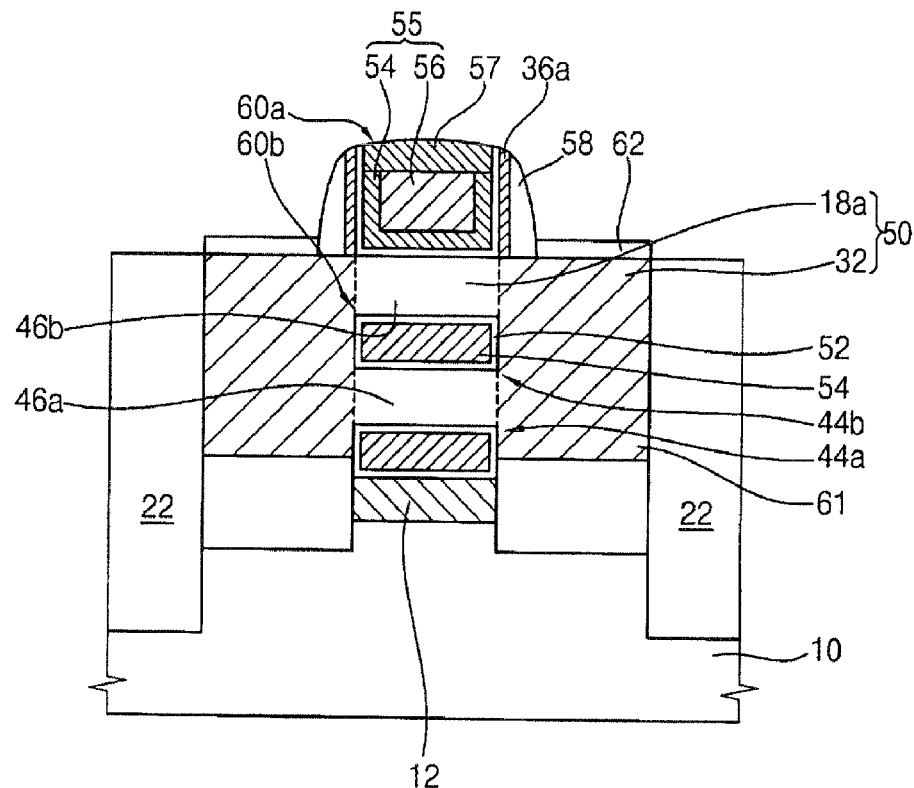
FIG. 2 is a cross-sectional view illustrating the MOS transistor having the multi-channels in FIGS. 1A and 1B.

FIG. 1A is a perspective view illustrating a gate electrode of a MOS transistor having multi-channels in accordance with an example embodiment of the present invention, FIG. 1B is a perspective view illustrating an active channel pattern of the MOS transistor having the multi-channels in FIG. 1A, and FIG. 2 is a cross-sectional view illustrating the MOS transistor having the multi-channels in FIGS. 1A and 1B.

Referring to FIGS. 1A, 1B and 2, a substrate 10 is prepared. The substrate 10 may include a silicon (Si) substrate, a silicon germanium (SiGe) substrate, a silicon-on-insulator (SOI) substrate, a silicon germanium-on-insulator (SGOI) substrate, etc. In this example embodiment, the bulk silicon substrate may be advantageously used as the substrate 10 in order to achieve a low cost and simple process.

Here, when the bulk silicon substrate is used as the substrate 10, a channel isolation region 12 is formed in a portion of the substrate 10 beneath a tunnel 44a corresponding to a lowermost layer of an active region 50. The channel isolation region 12 is doped heavily or lightly with impurities having a conductive type opposite to that of impurities in source/drain regions of a transistor. Thus, since a channel may not be formed under the tunnel 44a corresponding to the lowermost layer of the active channel pattern 50, a short channel effect may be minimized.

The active channel pattern 50 is formed on the substrate 10. The active channel pattern 50 includes a plurality of channels 46a and 46b arranged in a vertical direction. In this example embodiment, the number of the channels 46a and 46b is two. Alternatively, the number of the channels 46a and 46b may be one or at least three. The channels 46a and 46b may have a narrow width. Further, the channels 46a and 46b are stacked along the vertical direction. A plurality of tunnels 44a and 44b are formed between each of the channels 46a and 46b. The lowermost tunnel 44a is formed between the lowermost channel 46a and a portion of the substrate 10 under the lowermost channel 46a.

The active channel pattern 50 includes an active channel pattern 18a having the channels 46a and 46b and the tunnels 44a and 44b that are alternately arranged. Further, the active channel pattern 18a has vertical sidewalls.

The active channel pattern 50 additionally includes a source/drain layer 32 on the sidewalls of the active channel pattern 18a. The source/drain layer 32 is electrically connected to the channels 46a and 46b. In this example embodiment, the source/drain layer 32 may include a conductive layer such as a selective epitaxial single crystalline layer, a polysilicon layer, a metal layer, etc. When the source/drain layer 32 includes the selective epitaxial single crystalline layer or the polysilicon layer, impurities may be implanted into the source/drain layer 32 to form conductive source/drain regions 61.

A metal silicide layer 62 is formed on the source/drain layer 32. The metal silicide layer 62 may reduce a surface resistance between the source/drain regions 61 and a metal contact formed later. In this example embodiment, the metal silicide layer 62 may include a cobalt silicide layer.

The channels 46a and 46b may include a single crystalline semiconductor layer, preferably a silicon layer. The channels 46a and 46b are doped with n-type impurities or p-type impurities in accordance with the type of the transistor to be manufactured. For example, when an n-type transistor is to be manufactured, the channels 46a and 46b may be lightly doped with p-type impurities.

In contrast, the source/drain layer 32 is doped heavily or lightly with impurities having a conductive type opposite to that of the impurities in the channels 46a and 46b. For example, when the n-type transistor is to be manufactured, the source/drain layer 32 may be doped with n-type impurities.

A gate electrode 55 is formed on the active channel pattern 18a to fill up the tunnels 44a and 44b. The gate electrode 55 may extend along a vertical direction, which may be substantially perpendicular to an extending direction of the source/drain regions 61, to surround the channels 46a and 46b.

The gate electrode 55 includes a gate dielectric layer 52 and a gate conductive layer pattern. The gate dielectric layer 52 is formed on inner faces of the tunnels 44a and 44b and an upper face of the uppermost channel 46b. In this example embodiment, the gate dielectric layer 52 may include thermal oxide.

The gate conductive layer pattern includes a first conductive layer pattern 54 including titanium nitride and a second conductive layer pattern 56 including tungsten. The tunnels 44a and 44b are fully filled with the first conductive layer pattern 54. Further, the first conductive layer pattern 54 extends along a first direction crossing the active channel pattern 18a. In this example embodiment, a portion of the first conductive layer pattern 54 on the active channel pattern 50 may have a cylindrical shape. The second conductive layer pattern 56 is formed only on the active channel pattern 50. In this example embodiment, the second conductive layer pattern 56 may have a shape that is configured to fill inside the cylindrical first conductive layer pattern 54.

A capping layer pattern 57 is formed on the gate electrode 55. In this example embodiment, the capping layer pattern 57 may include silicon nitride.

A silicon nitride layer 36a is formed on the sidewalls of the gate electrode 55. A spacer 58 is additionally formed on sidewalls of the silicon nitride layer 36a.

Here, an upper portion of the gate electrode 55 protruded from the active channel pattern 50 serves as an upper gate 60a. A lower portion of the gate electrode 55 in the tunnels 44a and 44b of the active channel pattern 50 serves as a lower gate 60b.

In the MOS transistor of the present invention, the source/drain regions may have a uniform doping profile substantially perpendicular to the extending direction of the channels. Although not illustrated above, this may be caused by decreasing a thermal diffusion, because the doping process for forming the source/drain regions is carried out after formation of the gate electrode.

Therefore, the source/drain regions may have a uniform junction capacitance regardless of a number of the channels. As a result, a current flow speed may become faster while minimizing the junction capacitance so that the MOS transistor may have high operational speed.

Further, since the metal silicide layer is formed on the source/drain layer, the resistance between the source/drain layer and the contact may be reduced.

Figure 3A:
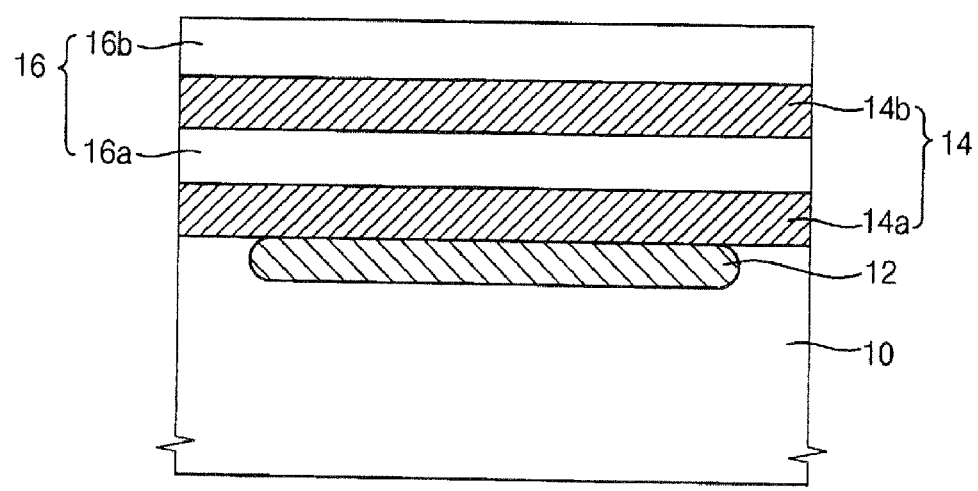
FIGS. 3A to 3P are cross-sectional views illustrating a method of manufacturing a semiconductor device in accordance with an example embodiment of the present invention.
Figure 3B:
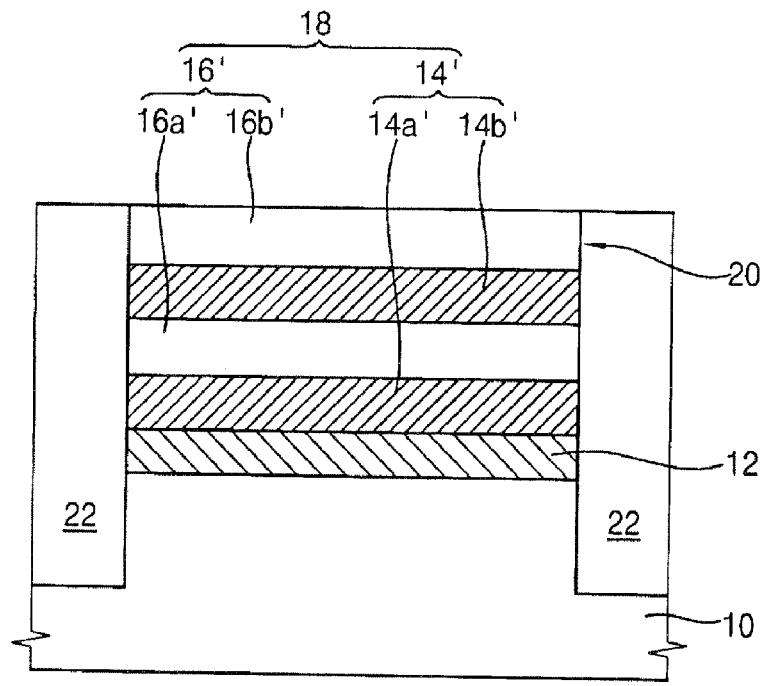
Figure 3C:
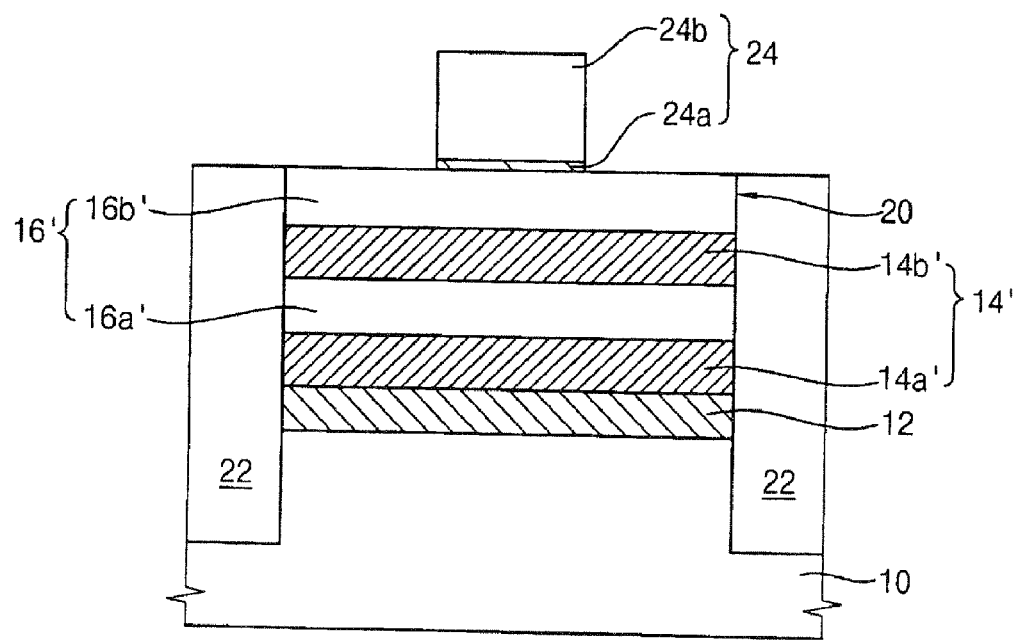
Figure 3D:
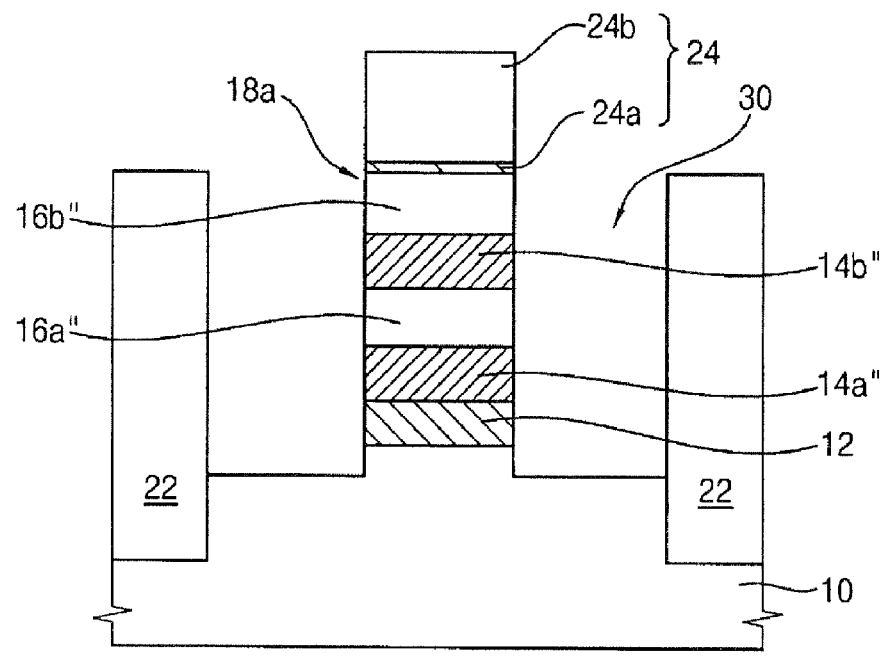
Figure 3E:
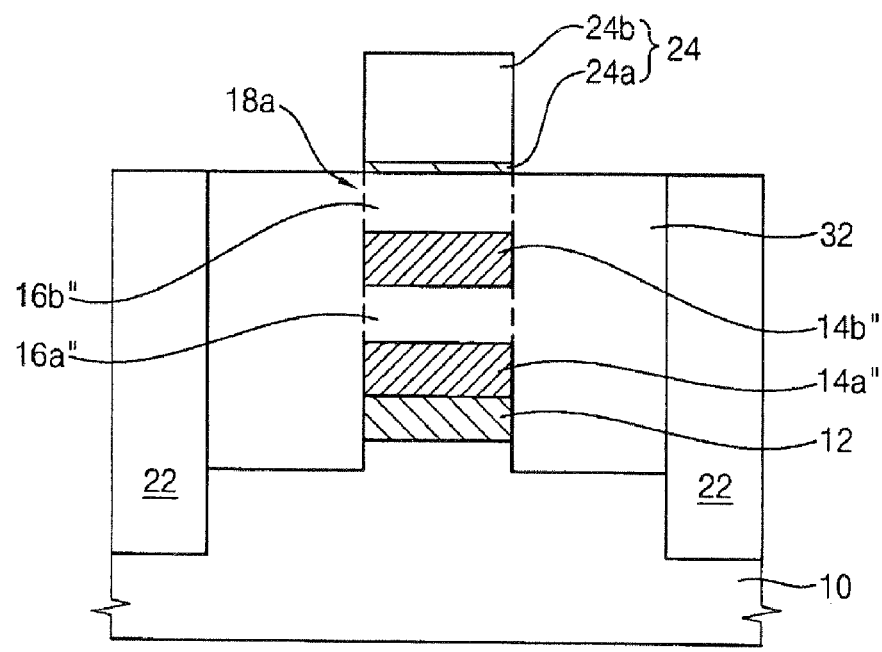
Figure 3F:
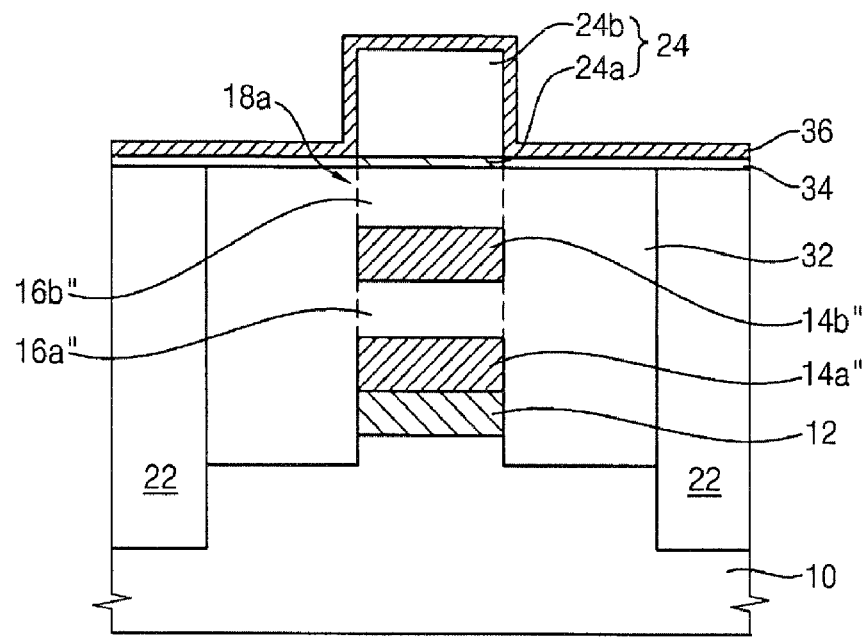
Figure 3G:
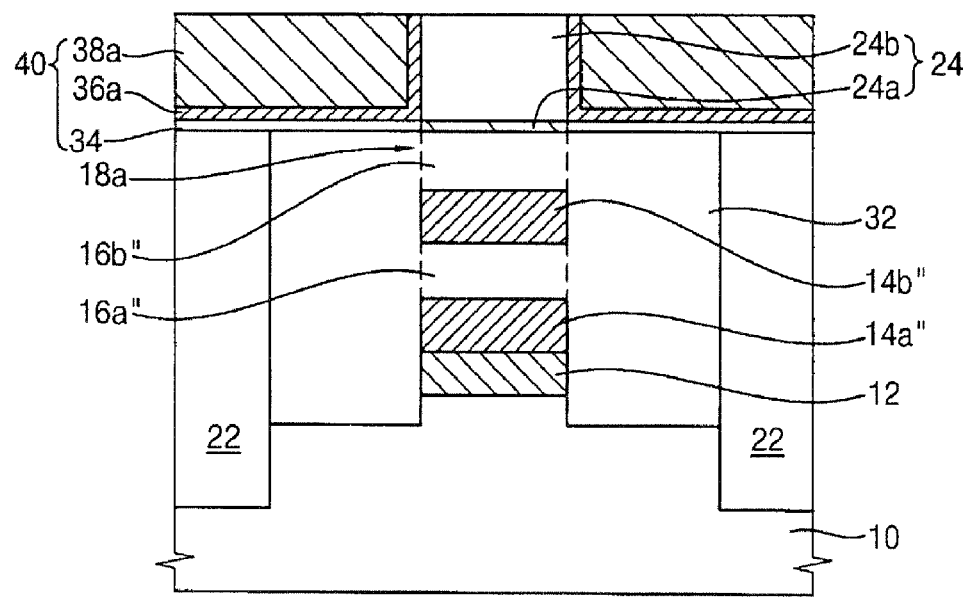
Figure 3H:
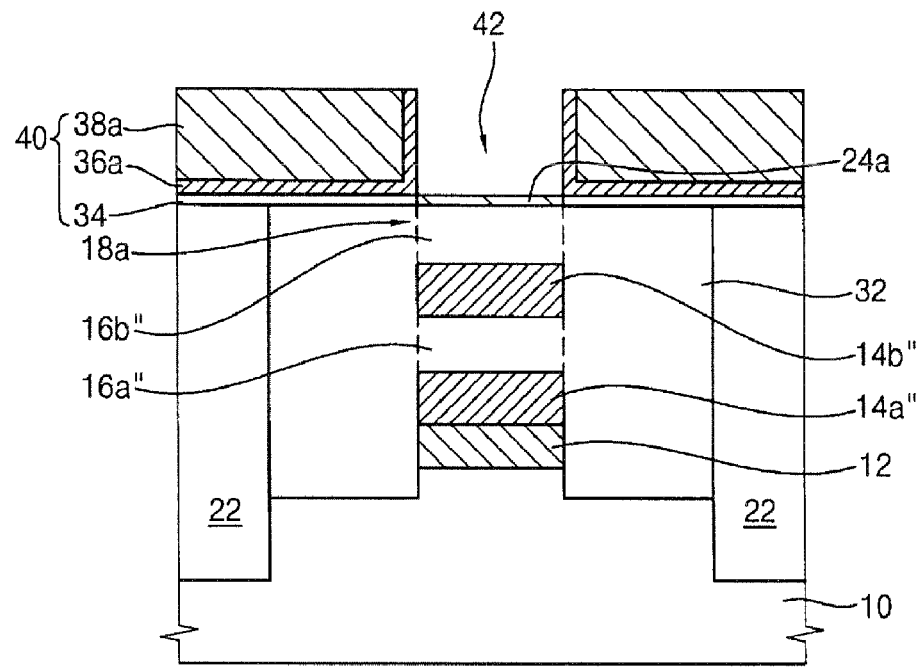
Figure 3I:
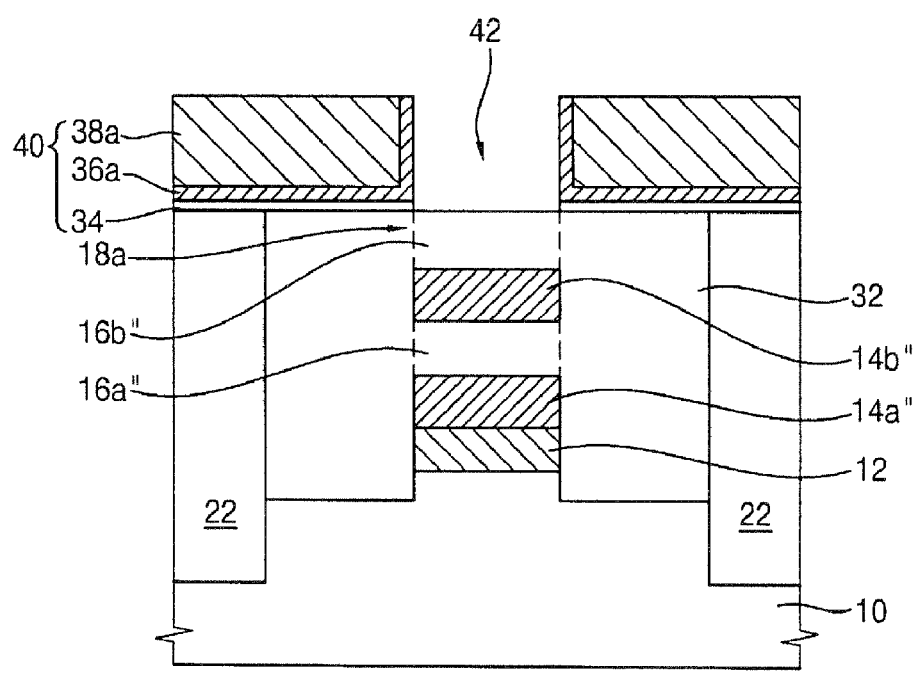
Figure 3J:
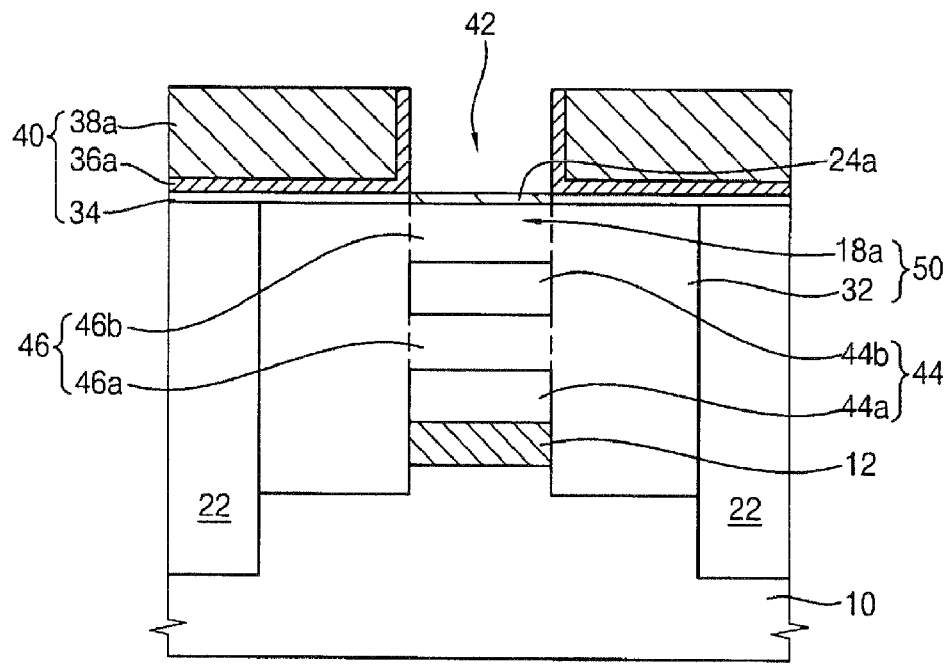
Figure 3K:
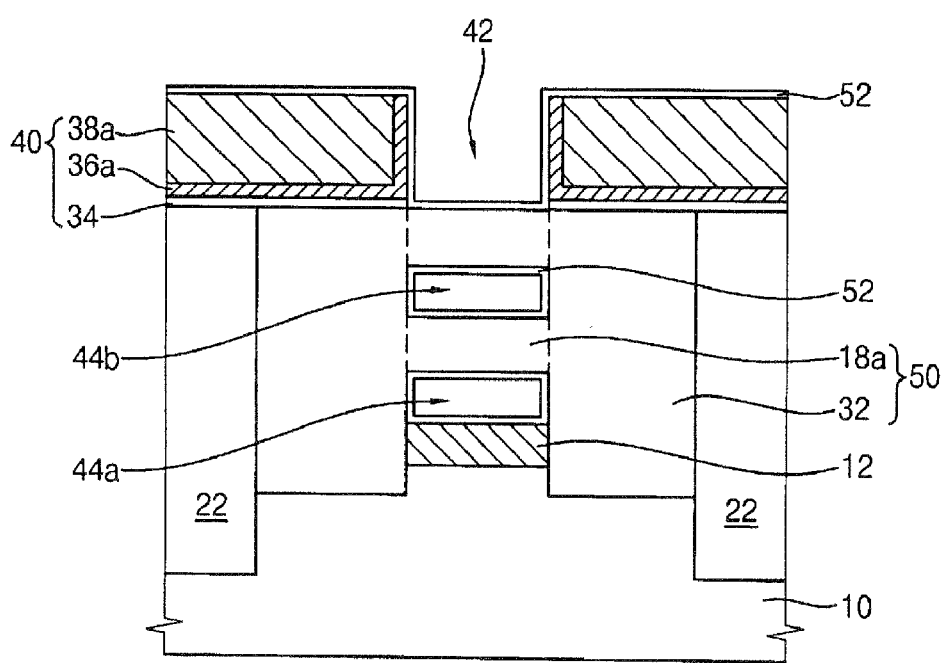
Figure 3L:
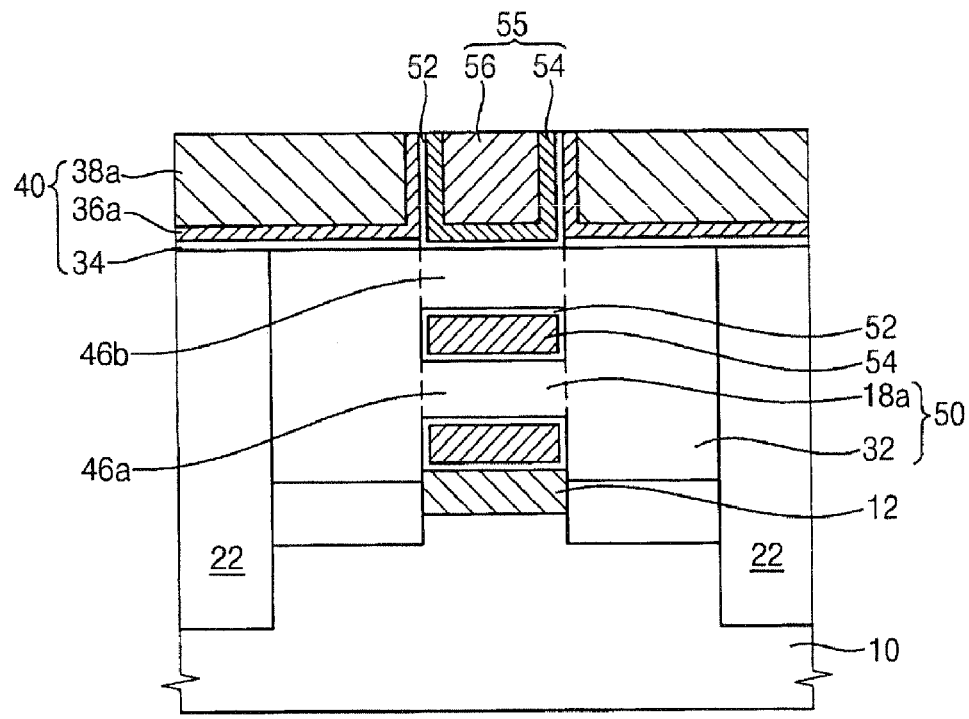
Figure 3M:
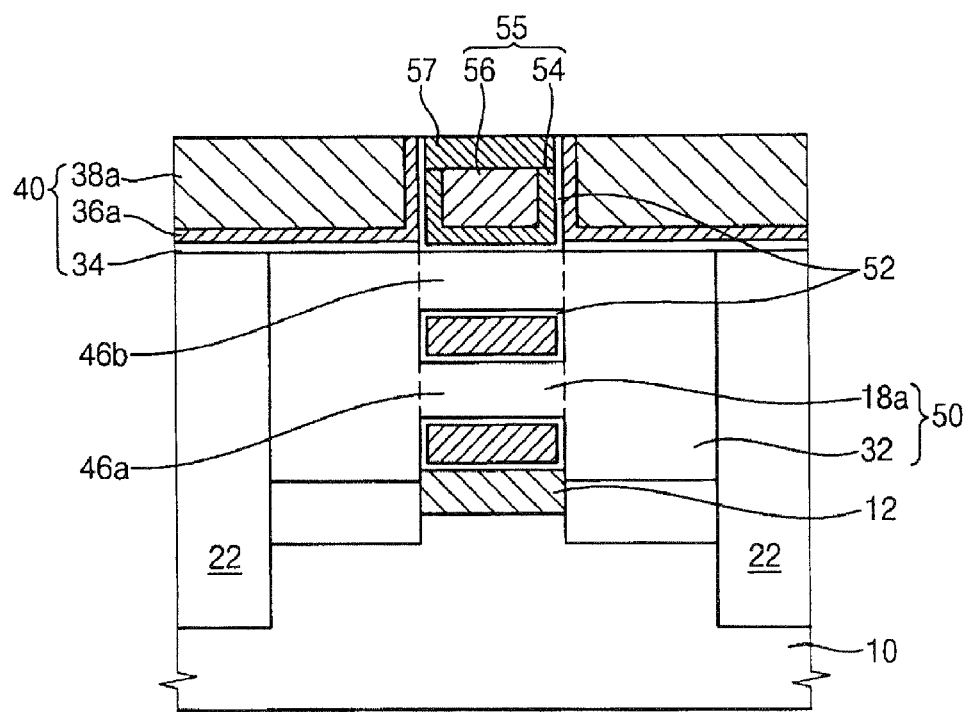
Figure 3N:
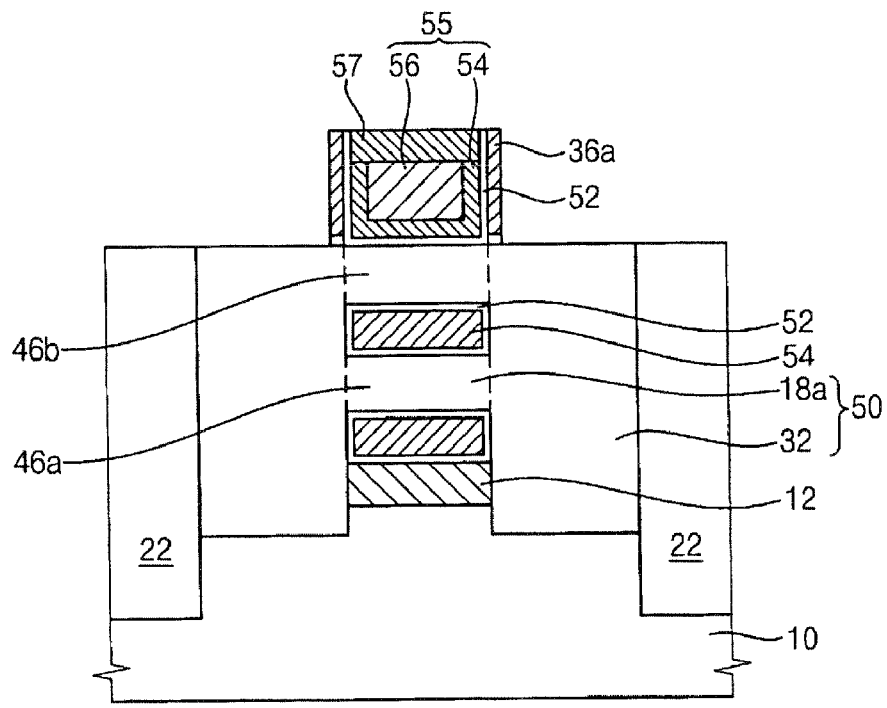
Figure 3O:
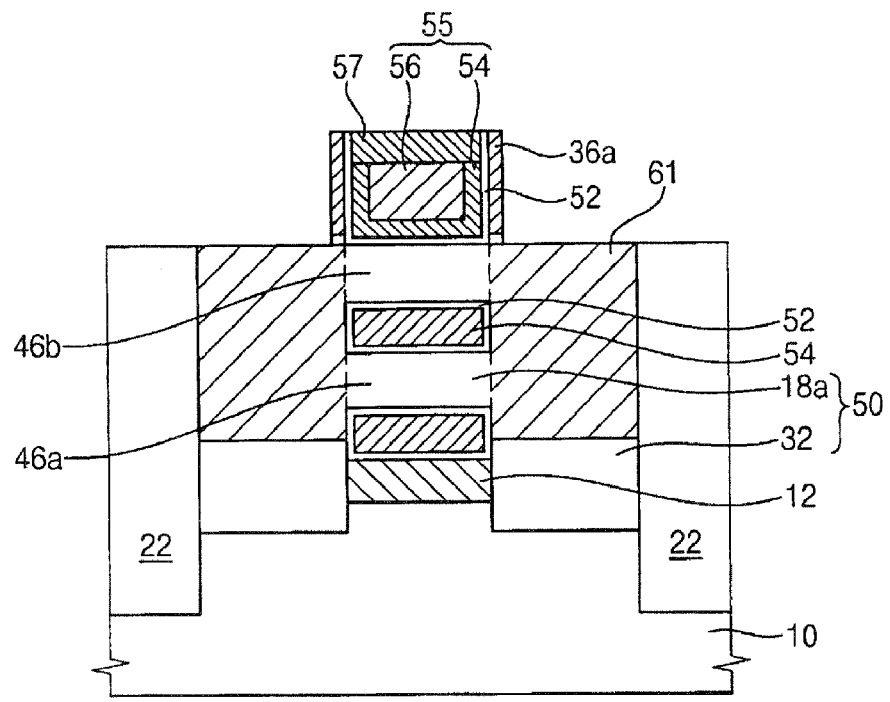
Figure 3P:
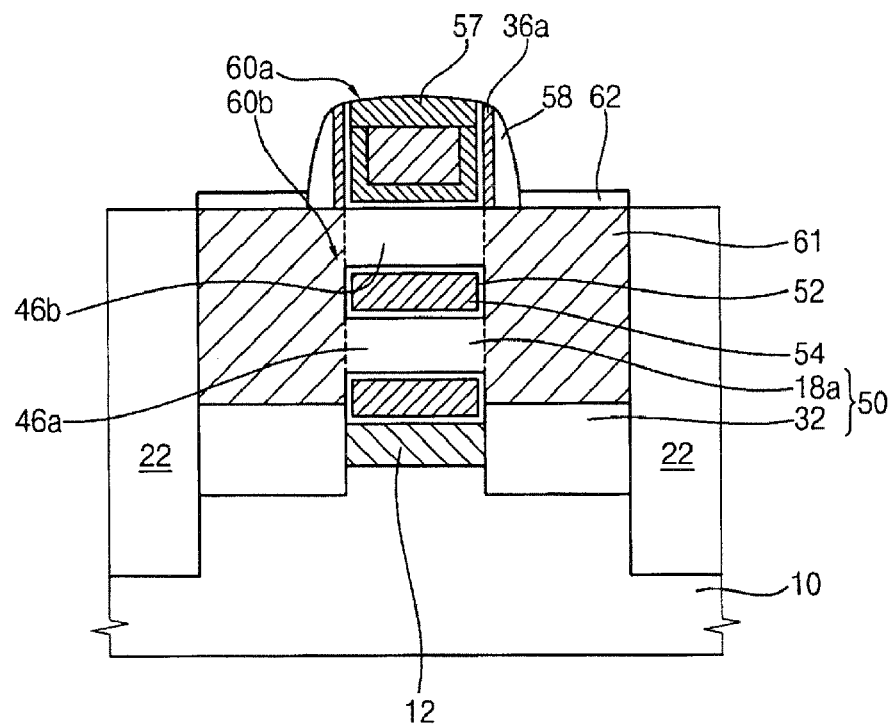
Figure 4A:
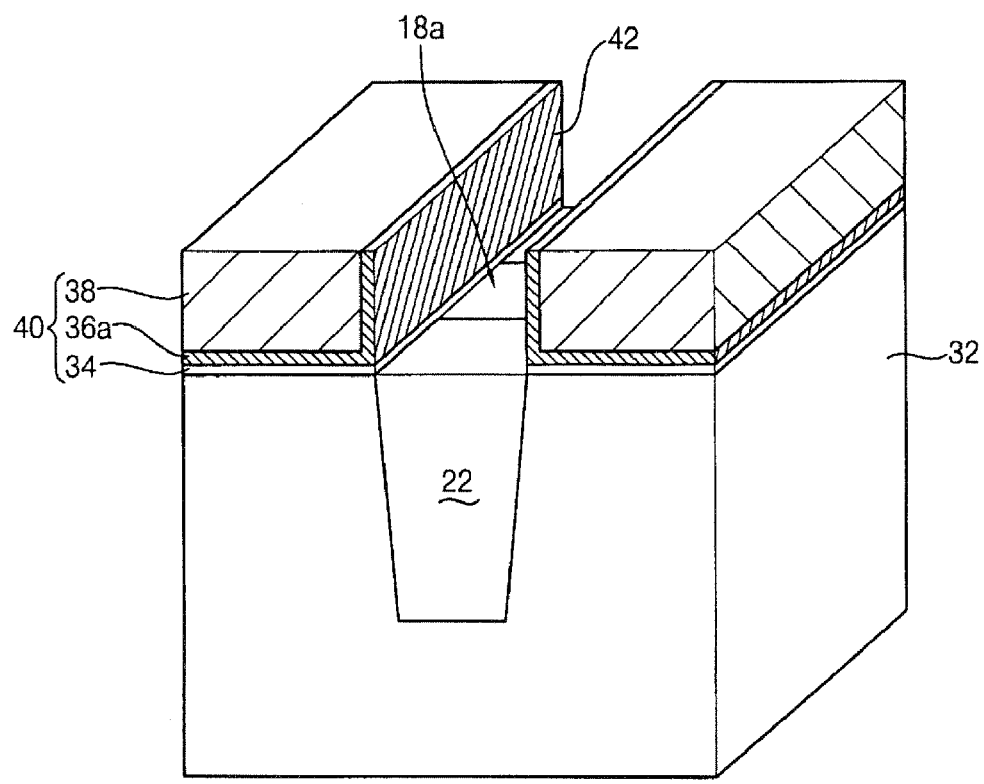
FIGS. 4A to 4C are perspective views illustrating the method of manufacturing the semiconductor device.
Figure 4B:
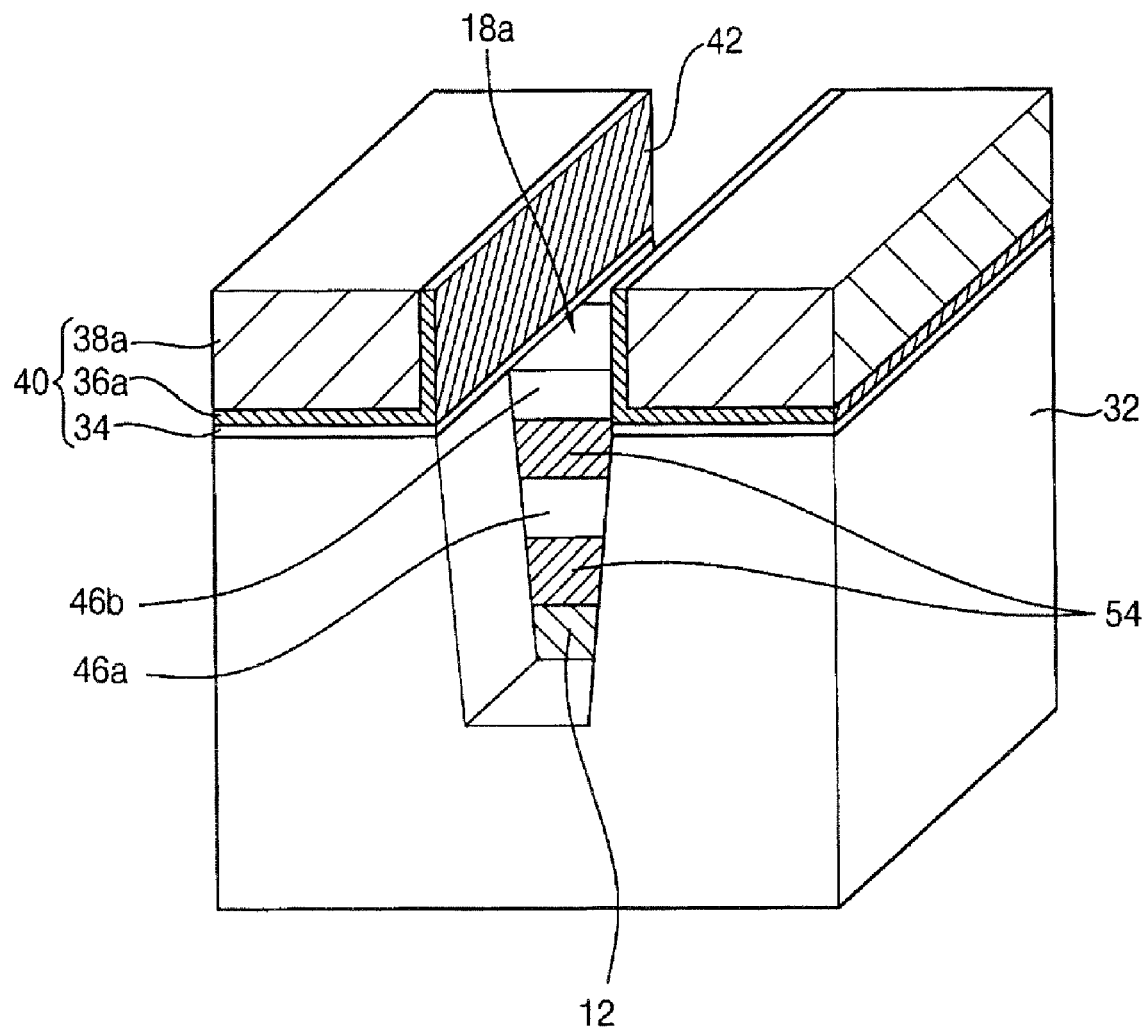
Figure 4C:
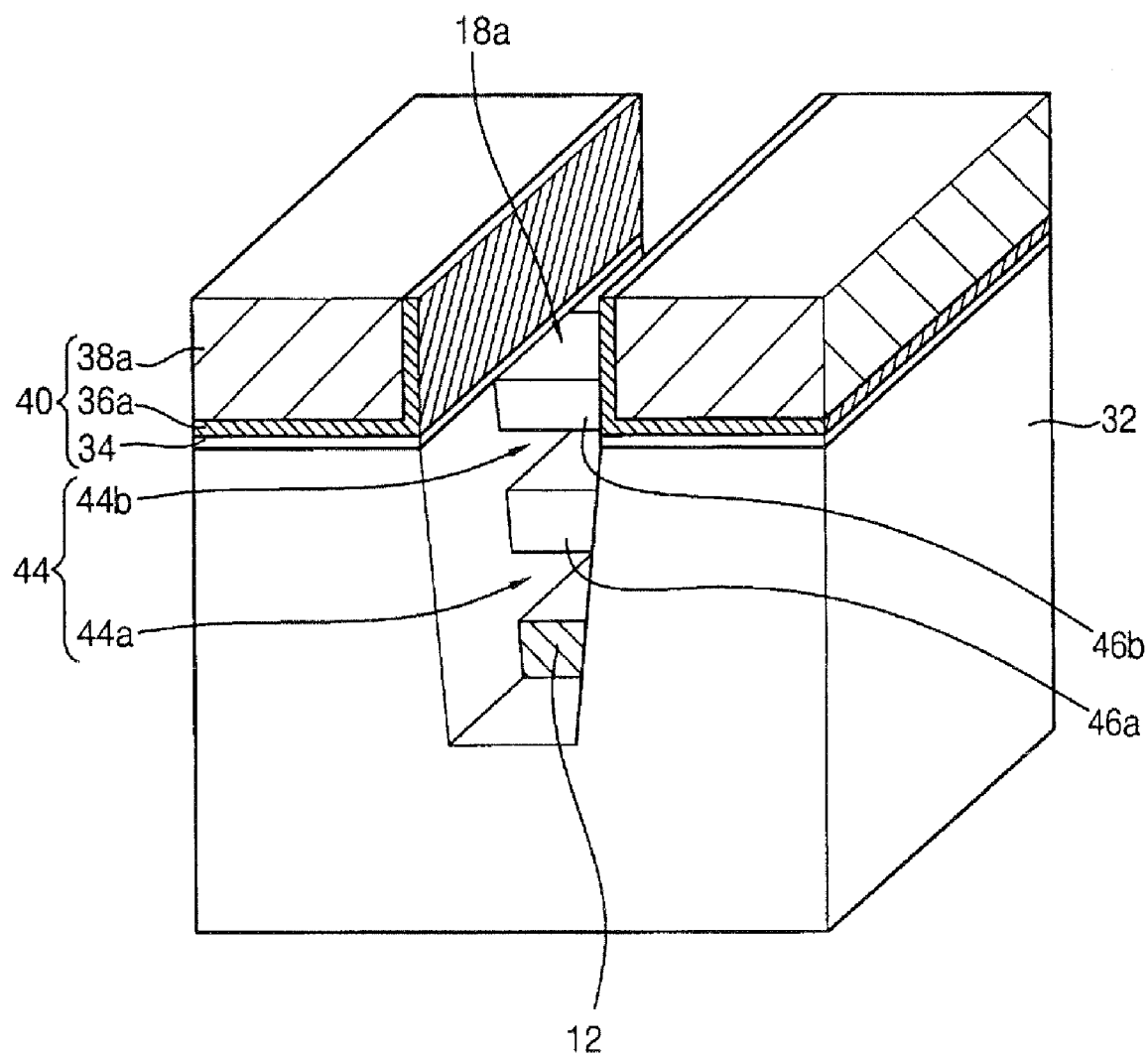

FIGS. 3A to 3P are cross-sectional views illustrating a method of manufacturing a semiconductor device in accordance with an example embodiment of the present invention, and FIGS. 4A to 4C are perspective views illustrating the method of manufacturing the semiconductor device.

Referring to FIG. 3A, conductive impurities are heavily implanted into a surface of a substrate 10 to form a channel isolation region 12 for preventing a base transistor from being formed during operation of the semiconductor device. In this example embodiment, the substrate 10 may include a single crystalline silicon substrate, a silicon germanium substrate, an SOI substrate, an SGOI substrate, etc. In this example embodiment, the single crystalline silicon substrate is used as the substrate 10.

The impurities having a high concentration may have a conductive type opposite to that of impurities in source/drain regions of a transistor. Thus, since the base transistor is not formed, a short channel effect may be minimized.

A plurality of gate layers 14 and a plurality of single crystalline silicon layers 16 are alternately formed on the substrate 10. In this example embodiment, a first gate layer 14a is formed on the substrate 10. A first single crystalline silicon layer 16a is then formed on the first gate layer 14a. A second gate layer 14b is formed on the first single crystalline silicon layer 16a. A second single crystalline silicon layer 16b is then formed on the second gate layer 14b.

In this example embodiment, the gate layers 14 may include a single crystalline semiconductor material having an etching selectivity with respect to that of the single crystalline silicon layer 16. Particularly, the single crystalline silicon layer 16 may have a thickness of about 300 Å. Further, the gate layers 14 may include a single crystalline germanium layer or a single crystalline silicon-germanium layer having a thickness of about 300 Å. The single crystalline silicon germanium layer is used as the gate layer 14. For example, the single crystalline silicon layer 16 and the gate layer 14 may be formed by an epitaxial growth process.

Here, a number of the stacked single crystalline silicon layers 16 and the gate layers 14, and a thickness thereof may be adjusted according to how the semiconductor device is applied.

A first pad oxide layer (not shown) is then formed on the second single crystalline silicon layer 16b. A mask pattern (not shown) for forming an active channel pattern is formed on the first pad oxide layer.

Referring to FIG. 3B, the first pad oxide layer, the single crystalline silicon layers 16 and the gate layers 14 are etched using the mask pattern as an etching mask to form a pad oxide layer pattern (not shown) and a preliminary active channel pattern 18. Here, the preliminary active channel pattern 18 includes a first silicon preliminary pattern 16' including a plurality of first single crystalline silicon patterns 16a' and 16b', and a first preliminary pattern 14' including a plurality of first patterns 14a' and 14b' that are stacked on the pad oxide layer pattern. The substrate 10 is continuously etched until sidewalls of the channel isolation region 12 are completely exposed to form isolation trenches 20.

The isolation trenches 20 are filled with an oxide layer (not shown) formed by a chemical vapor deposition (CVD) process. The oxide layer and the mask pattern are planarized until the pad oxide layer pattern is exposed to form isolation layer patterns 22 surrounding the preliminary active channel pattern 18. In this example embodiment, the planarization process may include an etch-back process, a chemical mechanical polishing (CMP) process, etc. Here, the preliminary active channel pattern 18 may have an isolated island shape. The mask pattern is then removed by a stripping process.

Referring to FIG. 3C, a first silicon nitride layer (not shown) and a silicon oxide layer (not shown) for forming a dummy gate are sequentially formed on the pad oxide layer pattern and the isolation layer patterns 22. Here, the first silicon nitride layer may have an etching selectivity with respect to the silicon oxide layer. In this example embodiment, silicon nitride may be deposited to form the first silicon nitride layer having a thickness of about 100 Å to about 200 Å. The first silicon nitride layer may be used as an etching stop layer during etching the silicon oxide layer.

The silicon oxide layer may define a gate region. In this example embodiment, silicon oxide may be deposited to form the silicon oxide layer having a thickness of about 1,000 Å to about 3,000 Å.

A photoresist pattern (not shown) is then formed on the silicon oxide layer to expose the preliminary active channel pattern 18. The silicon oxide layer is etched using the photoresist pattern as an etching mask and the first silicon nitride layer as an etching stop layer to form a dummy gate pattern 24b. The first silicon nitride layer is dry-etched using the dummy gate pattern 24b as an etching mask to form a first silicon nitride layer pattern 24a, thereby completing a gate hard mask 24 including a first silicon nitride layer pattern 24a and the dummy gate pattern 24b on the pad oxide layer pattern.

Here, the gate hard mask 24 may function so as to self-align the source/drain regions and the channel region with each other.

Referring to FIG. 3D, the preliminary active channel pattern 18 is etched using the gate hard mask 24 as an etching mask to form opening 30. Here, the etching process may be carried out until the sidewalls of the channel isolation region 12 are completely exposed.

As a result, when the above-mentioned etching process is completed, an active channel pattern 18a is formed beneath the gate hard mask 24. Here, active channel pattern 18a includes a second single crystalline silicon pattern 16" including a plurality of second single crystalline silicon patterns 16a" and 16b", and a second preliminary pattern 14" including a plurality of second patterns 14a" and 14b".

Additionally, the second single crystalline silicon patterns 16a" and 16b" and the second patterns 14a" and 14b" exposed through sidewalls of the active channel pattern 18a may be isotropically etched to reduce a width of the active channel pattern 18a. This process may be referred to as a channel trimming process. Here, the etching process may include a chemical dry etching process using free radicals of an etching gas. The active channel pattern 18a formed by the above-mentioned etching process may have a width less than that of a pattern formed by a photolithography process.

Referring to FIG. 3E, a single crystalline layer (not shown) is formed on the isolation layer patterns 22 by a selective epitaxial growth process to fill up the openings 30 between the active channel pattern 18a and the isolation layer patterns 22.

The single crystalline layer is then planarized by an etch-back process or a CMP process until a surface of the active channel pattern 18a is exposed to form source/drain layers 32 in the opening 30.

Referring to FIG. 3F, a second pad oxide layer 34 is formed on the source/drain layers 32 and the isolation layer patterns 22 by a thermal oxidation process. A second silicon nitride layer 36 is then formed on an upper face of the second pad oxide layer 34, and an upper face and a sidewall of the gate hard mask 24. Here, the second silicon nitride layer 36 may function as an etching stop layer in subsequent processes.

Referring to FIG. 3G, a polysilicon layer (not shown) is formed on the second silicon nitride layer 36 to cover the dummy gate pattern 24b. The polysilicon layer and the second nitride layer 36 are planarized by an etch-back process or a CMP process until a surface of the dummy gate pattern 24b is exposed to form mask pattern structures 40 including a second silicon nitride layer pattern 36a and a polysilicon layer pattern 38a on the second pad oxide layer 34.

Referring to FIG. 3H, the dummy gate pattern 24b is selectively removed to form a gate trench 42 between the mask pattern structures 40.

Here, since the first silicon nitride layer pattern 24a having a high etching selectivity is formed beneath the dummy gate pattern 24b, during removal of the dummy gate pattern 24b, only the dummy gate pattern 24b is selectively removed. Thus, the second single crystalline silicon pattern 16b" may not be etched during etching of the dummy gate pattern 24b.

Referring to FIG. 3I, the first silicon nitride layer pattern 24a exposed through the gate trench 42 is then removed.

Impurities are implanted into the active channel pattern 18a in the channel region through the gate trench 42. In this example embodiment, the impurities may be implanted into the second single crystalline silicon patterns 16a" and 16b" using wide transmission ranges.

Although not shown in the figures, the gate trench 42 may have an upper width and a lower width wider than the upper width. In this case, to provide the gate trench 42 with a vertical sidewall, an inner spacer (not shown) including silicon oxide may be additionally formed on the sidewall of the gate trench 42.

FIG. 4A is a perspective view illustrating a semiconductor device after performing the above-mentioned processes.

Referring to FIG. 4A, the isolation layer patterns 22 are exposed through a front face and a rear face of the active channel pattern 18a.

Referring to FIGS. 3J and 4B, the isolation layer patterns 22 exposed through a bottom face of the gate trench 42 are selectively etched to expose the front face and the rear face of the active channel pattern 18a.

Referring to FIGS. 3J and 4C, the second patterns 14a" and 14b" are selectively removed by an isotropic etching process using an etching solution, which has an etching selectivity with respect to silicon and silicon germanium, to form a plurality of tunnels 44a and 44b passing through the active channel pattern 18a. Here, the second single crystalline silicon patterns 16a" and 16b" are converted into a plurality of channels 46a and 46b.

As a result, after performing the above-mentioned processes, an active channel pattern 50 having a flat surface is completed on the substrate 10. The active channel pattern 50 includes the active channel pattern 18a having the tunnels 44a and 44b, and the source/drain layers 32 at both sides of the tunnels 44.

Referring to FIG. 3K, a gate dielectric layer 52 is formed on inner faces of the tunnels 44a and 44b and the gate trench 42 by a thermal oxidation process. In this example embodiment, the gate dielectric layer 52 may have a thickness of about 10 Å to about 70 Å. Further, the gate dielectric layer 52 may include a silicon oxide layer, a silicon oxynitride layer, etc.

Referring to FIG. 3L, a first conductive layer pattern 54 is partially formed on a bottom face and a sidewall of the gate trench 42 to fill up the tunnels 44a and 44b. Here, the first conductive layer pattern 54 surrounds the channels 46a and 46b. In this example embodiment, the first conductive layer pattern 54 may include titanium nitride. A second conductive layer pattern 56 for reducing a resistance of the gate is formed on the first conductive layer pattern 54 to fill up the gate trench 42. In this example embodiment, the second conductive layer pattern 56 may include tungsten having a low resistance. As a result, a gate electrode including the first conductive layer pattern 54 and the second conductive layer pattern 56 is completed on the gate insulation layer 52. In this example embodiment, the gate electrode 55 fills up the tunnels 44a and 44b and also penetrates through the active channel pattern 18a. Further, the gate electrode 55 has an upwardly protruded portion from the surface of the active channel pattern 18a.

In further detail, titanium nitride is deposited on the isolation layer patterns 18a and the gate trench 42 by a CVD process until the tunnels 44a and 44b are fully filled to form a first conductive layer (not shown). The first conductive layer is then planarized until surfaces of the mask pattern structures 40 are exposed, thereby forming the first conductive layer pattern 54 on the bottom face and the sidewall of the gate trench 42 and in the tunnels 44a and 44b.

Tungsten is deposited by a CVD process until the gate trench 42 is fully filled to form a second conductive layer (not shown). The second conductive layer is then planarized until the surfaces of the mask pattern structures 40 are exposed to form the second conductive layer pattern 56, thereby completing the gate electrode 55 including the first conductive layer pattern 54 and the second conductive layer pattern 56.

Referring to FIG. 3M, upper portions of the second conductive layer pattern 56 and the first conductive layer pattern 54 in the gate electrode 55 are partially removed to form an opening (not shown), thereby forming a gate capping layer pattern. The opening is then fully filled with a first capping layer (not shown) including silicon nitride. The gate capping layer is removed by a CMP process until the mask pattern structures 40 are exposed to form the capping layer pattern 57 in the opening.

Referring to FIG. 3N, the polysilicon layer pattern 38a is removed using the second silicon nitride layer pattern 36a as an etching stop layer. In this example embodiment, the polysilicon layer pattern 38a may be removed by an isotropic etching process.

After removing the second silicon nitride layer pattern 36a, the second pad oxide layer 34 is then removed to completely remove the mask pattern structures 40. Here, the second silicon nitride layer pattern 38a and the second pad oxide layer 34 still remain on the gate dielectric layer 52 formed on both sidewalls of the gate electrode 55.

Referring to FIG. 3O, impurities are heavily implanted into the source/drain layers 32 to form source/drain regions 61 having uniform impurity concentrations in the source/drain layers 32.

As described above, according to this example embodiment, the source/drain regions 61 may be formed by doping the impurities using the gate electrode 55, which is formed by a damascene process, as an ion implantation mask. Thus, thermal budget with respect to the source/drain regions 61 formed by this example embodiment may be relatively reduced compared to conditions under which an ion implantation process for forming source/drain regions may be performed before forming a gate electrode by a damascene process.

Particularly, according to a conventional method, since the source/drain regions may be formed before forming the gate electrode, high temperature processes such as a process for forming a gate dielectric layer, various deposition processes, etc., may be required. Therefore, ions in the source/drain regions may diffuse while performing the high temperature processes so that an effective channel length may be shortened. In contrast, according to this example embodiment, since the ion implantation process for forming the source/drain regions is carried out after forming the gate electrode, a thermal diffusion of the ions may be minimized. As a result, the effective channel length may still be maintained so that a short channel effect may be minimized.

Referring to FIG. 3P, a second gate capping layer (not shown) is formed on the gate electrode 55 including the second silicon nitride layer pattern 36a and the capping layer pattern 57. The second gate capping layer is then isotropically etched to form a spacer 58 including silicon nitride on a sidewall of the gate electrode 55.

In this example embodiment, the gate electrode 55 may be divided into an upper gate 60a on the active channel pattern 50, and a lower gate 60b passing through the active channel pattern 50.

Referring again to FIG. 2, a metal silicide layer 62 is selectively formed on the source/drain layers 32. Here, the metal silicide layer 62 on the source/drain layers 32 may reduce resistances of the source/drain regions 61 and a contact formed by a subsequent process.

In this example embodiment, a cobalt layer (not shown) is formed on an upper face and a sidewall of the gate electrode 55 and an upper face of the source/drain layers 32. After forming the cobalt layer, the cobalt layer is heated to react the cobalt layer with the source/drain layers 32, thereby forming a cobalt silicide layer 62. A non-reacted portion of the cobalt layer is then removed to form the cobalt silicide layer 62 only on the source/drain layers 32. Here, the cobalt silicide layer 62 may not be formed on an upper face and a sidewall of the upper gate 60*a* due to the spacer 58 on the upper face and the sidewall of the upper gate 60*a*. Thus, an electrical short between the upper gate 60*a* and the cobalt silicide layer 62 on the source/drain layers 32 may be prevented.

As mentioned above, since the mask pattern structures 40 may be removed after forming the gate 60, single crystalline silicon may be exposed through the surface of the source/drain layers 32. Thus, a silicidation process may be carried out on the exposed single crystalline silicon so that the source/drain regions may have an improved surface resistance.

The gate 60 is then covered with an insulation interlayer (not shown). A contact hole (not shown) is formed through the insulation interlayer. The contact hole is filled with a contact (not shown) including tungsten electrically connected to an aluminum wiring (not shown) on the insulation interlayer.

Here, the mask pattern structures and the insulation interlayer may be etched by two-stepped processes to form the contact hole according to a conventional method. In contrast, according to this example embodiment, since the mask pattern structures may be previously removed during forming the gate by the damascene process, the contact hole may be formed by a one-step process.

According to the present invention, since the ion implantation process may be carried out on the source/drain layers after forming the gate by the damascene process, less of the thermal budget may be applied to the source/drain regions. Thus, the thermal diffusion of the ions in the source/drain regions may be prevented. Further, the effective channel length may be lengthened so that the short channel effect may be minimized.

Moreover, since the single crystalline silicon layer of the source/drain regions may be exposed after forming the gate, the silicidation process may be applied to the source/drain regions so that the source/drain regions may have an improved resistance.

Furthermore, when the mask pattern structure remains during the etching process for forming the metal contact, the insulation interlayer and the mask pattern structure may be etched twice. In contrast, since the mask pattern structures may be previously removed in the present method, the etching process may be carried out once so that a process efficiency may be improved.

In a method of manufacturing a semiconductor device having multi-channels in accordance with one aspect of the present invention, an active channel pattern is formed on a substrate. Here, the active channel pattern includes preliminary gate patterns and single crystalline silicon patterns that are alternately stacked with each other. Silicon grows from a sidewall of the active channel pattern to form a source/drain layer. Mask pattern structures including a gate trench are formed on the active channel pattern and the source/drain layer. The patterns for forming the gate are selectively etched to form a plurality of tunnels. The gate trench between a plurality of the tunnels and a plurality of the mask pattern structures is then filled with a gate electrode. Here, the gate electrode surrounds the active channel pattern. Further, the gate electrode is protruded from an upper face of the active channel pattern. The mask pattern structures are then removed. Impurities are implanted into the source/drain regions to form source/drain regions, thereby completing the semiconductor device having the multi-channels.

According to one example embodiment, the active channel pattern may be completed by forming a preliminary active channel pattern that includes a plurality of gate layers and the single crystalline layers that are alternately stacked with each other by forming a hard mask on the preliminary active channel pattern, and by etching the preliminary active channel pattern using the hard mask as an etching mask until a surface of the substrate is exposed.

Further, after forming the preliminary active channel pattern, an isolation layer pattern spaced apart from the both sidewalls of the active channel pattern may be additionally formed on the substrate. Also, after forming the isolation layer pattern, the isolation layer pattern may be partially removed to expose the patterns for forming the gate.

Furthermore, the hard mask may be formed on a region where the gate electrode is to be formed. The hard mask may include a silicon nitride layer pattern and a dummy gate pattern including silicon oxide formed on the silicon nitride layer pattern.

According to another example embodiment, forming the mask pattern structures may include forming a pad oxide layer on the source/drain layer. A second silicon nitride layer may be formed on an upper face of the pad oxide layer, and an upper face and a sidewall of the hard mask. A polysilicon layer may be formed on the second silicon nitride layer to fill up the dummy gate pattern. The polysilicon layer may be planarized until a surface of the dummy gate pattern is exposed to form a polysilicon layer pattern and a second silicon nitride layer pattern. The dummy gate pattern may then be removed.

Here, the patterns for forming the gate may include germanium or silicon-germanium having an etching selectivity with respect to the single crystalline silicon patterns.

Further, impurities may be heavily implanted into a surface of the substrate beneath a lowermost pattern for forming the gate, to thereby complete a channel isolation region. Here, the impurities may have a conductive type opposite to that of the source/drain regions.

According to still another example embodiment, the source/drain layers may be formed by performing a selective epitaxial growth process on a sidewall of the active channel pattern and an upper face of the substrate to form a single crystalline layer filling openings at both sides of the active channel pattern, and by planarizing a surface of the single crystalline layer.

Here, the selective etching process for forming the tunnels may include an isotropic etching process.

According to yet another example embodiment, forming the gate electrode may include forming a gate dielectric layer on a bottom face of the gate trench and an entire face of the tunnels between the mask pattern structures. A first conductive layer may be formed on the mask pattern structures and the gate dielectric layer to fill up the tunnels. A second conductive layer for reducing a resistance of the gate may be formed on the first conductive layer. The second conductive layer may be chemically mechanically polished until surfaces of the mask pattern structures are exposed to form the gate electrode in the gate trench.

Further, after forming the gate electrode, upper portions of the first conductive layer and the second conductive layer in the gate electrode may be partially etched. The etched upper portions of the gate electrode may be filled with a silicon nitride layer. The silicon nitride layer may be chemically mechanically polished until the mask pattern structures are exposed to additionally form a capping layer pattern on the etched upper portions of the gate electrode. Here, the first conductive layer may include titanium nitride, and the second conductive layer may include tungsten.

Furthermore, after forming the source/drain layers, a silicidation process may be carried out on the source/drain regions to form a metal silicide layer on the source/drain layers.

According to another example embodiment, forming the metal silicide layer may include forming a cobalt layer on an upper face and a sidewall of the gate electrode and an upper face of the source/drain layers. The cobalt layer may be reacted with the source/drain layers to form a cobalt silicide layer. A non-reacted portion of the cobalt layer may then be removed.

According to the present invention, since the mask pattern structures for forming the gate on the active channel pattern may be removed after forming the gate, the process for implanting the ions into the source/drain layers may be carried out after forming the gate. Thus, the ion implantation process with respect to the source/drain layers may be carried out after performing a high temperature process for forming the gate such as the process for forming the gate dielectric layer, various deposition processes, etc., so that less of the thermal budget may be applied to the source/drain regions. As a result, a thermal diffusion of the ions may be minimized. Further, an effective channel length may be lengthened so that a short channel effect may be minimized.

Furthermore, since the single crystalline layer of the source/drain regions may be exposed after forming the gate, a silicidation process may be carried out on the surface of the source/drain regions. As a result, a resistance between the source/drain regions and a contact to be subsequently formed may be reduced.

According to an embodiment of the present invention, a semiconductor device includes: a substrate; a channel isolation region disposed on the substrate; a gate disposed on the channel isolation region, the gate including upper and lower gates and the lower gate including one or more lower gate patterns; one or more channels disposed between the one or more lower gate patterns and the upper gate; source/drain regions disposed on the substrate and adjacent to the gate; and isolation layer patterns disposed on the substrate and adjacent to the source/drain regions. The semiconductor device may further comprise a metal silicide layer disposed on the source/drain regions.

According to some embodiments the lower gate patterns and the upper gate comprise a first conductive layer pattern. The first conductive layer pattern may include titanium nitride. Also, the upper gate may comprise a second gate conductive layer pattern. The second gate conductive layer pattern may comprise tungsten.

According to some embodiments, the upper gate and the lower gate patterns comprise a gate dielectric layer.

The semiconductor device according to some embodiments further includes: a silicon nitride layer disposed on sidewalls of the upper gate; spacers disposed on the silicon nitride layer; and a capping layer pattern disposed on the upper gate.

Having described the preferred embodiments of the present invention, it is noted that modifications and variations can be made by persons skilled in the art in light of the above teachings. It is therefore to be understood that changes may be made in the particular embodiment of the present invention disclosed which is within the scope and the spirit of the invention outlined by the appended claims.

What is claimed is:

1. A method of manufacturing a semiconductor device, comprising:

forming an active channel pattern on a substrate, the active channel pattern including preliminary gate patterns and single crystalline silicon patterns that are alternately stacked;

growing silicon from sidewalls of the active channel pattern to form source/drain layers;

forming mask pattern structures having gate trenches on the active channel pattern and the source/drain layers;

selectively etching the preliminary gate patterns to form a plurality of tunnels;

filling the tunnels and the gate trenches between the mask pattern structures with a gate electrode, the gate electrode substantially surrounding the active channel pattern and having a protruded portion protruding from a surface of the active channel pattern; and implanting impurities into the source/drain layers to form source/drain regions.

2. The method of claim 1, wherein forming the active channel pattern comprises:

forming a preliminary active channel pattern on the substrate, the preliminary active channel pattern including a plurality of gate layers and a plurality of single crystalline silicon layers that are alternately stacked;

forming a hard mask on the preliminary active channel pattern; and etching the preliminary active channel pattern using the hard mask as an etching mask until a surface of the substrate is exposed to form the active channel pattern.

3. The method of claim 2, further comprising forming an isolation layer pattern spaced apart from both sidewalls of the active channel pattern on the substrate after forming the preliminary active channel pattern.

4. The method of claim 3, further comprising partially removing the isolation layer pattern to expose the preliminary gate patterns after forming the isolation layer pattern.

5. The method of claim 2, wherein the hard mask is formed on a portion of the preliminary active channel pattern where the gate electrode is formed, and the hard mask comprises a first silicon nitride layer pattern and a dummy gate pattern, including silicon oxide, sequentially stacked.

6. The method of claim 5, wherein forming the mask pattern structures comprises:

forming a pad oxide layer on the source/drain layers;

forming a silicon nitride layer on an upper face of the pad oxide layer, and an upper face and a sidewall of the hard mask;

forming a polysilicon layer on the silicon nitride layer to cover the dummy gate pattern with the polysilicon layer;

planarizing the polysilicon layer until a surface of the dummy gate pattern is exposed to form a polysilicon layer pattern and a second silicon nitride layer pattern; and removing the dummy gate pattern.

7. The method of claim 1, wherein the preliminary gate patterns comprise germanium or silicon-germanium having an etching selectivity with respect to the single crystalline silicon patterns.

8. The method of claim 1, further comprising heavily implanting impurities into a surface of the substrate beneath a lowermost pattern to form a channel isolation region, the impurities having a conductive type opposite to that of the source/drain regions.

9. The method of claim 1, wherein forming the source/drain layers comprises:

performing a selective epitaxial growth process on a sidewall of the active channel pattern and an upper face of the substrate to form a single crystalline layer that fills openings at both sides of the active channel pattern; and planarizing a surface of the single crystalline layer.

10. The method of claim 1, wherein selectively etching the preliminary gate patterns comprises an isotropic etching process.

11. The method of claim 1, wherein forming the gate electrode comprises:

forming a gate dielectric layer on a bottom face of the gate trenches and an entire face of the tunnels between the mask pattern structures;

forming a first conductive layer on the mask pattern structures and the gate dielectric layer to fill up the tunnels;

forming a second conductive layer on the first conductive layer; and chemically mechanically polishing the second conductive layer until surfaces of the mask pattern structures are exposed to form the gate electrode in the gate trenches.

12. The method of claim 11, after forming the gate electrode, further comprising:

partially etching upper portions of the second conductive layer and the first conductive layer in the gate electrode;

filling the etched upper portions of the gate electrode with a silicon nitride layer; and chemically mechanically polishing the silicon nitride layer until the mask pattern structures are exposed to form a capping layer pattern on the etched upper portions of the gate electrode.

13. The method of claim 11, wherein the first conductive layer comprises titanium nitride, and the second conductive layer comprises tungsten.

14. The method of claim 1, after forming the gate electrode, further comprising removing the mask pattern structures.

15. The method of claim 1, further comprising performing a silicidation process on the source/drain layers to form a metal silicide layer on the source/drain layers after forming the source/drain regions.

16. The method of claim 15, wherein forming the metal silicide layer comprises:

forming a cobalt layer on an upper face and a sidewall of the gate electrode, and an upper face of the source/drain layer;

reacting the cobalt layer with the source/drain layers to form a cobalt silicide layer; and removing a non-reacting portion of the cobalt layer.

17. A method of manufacturing a semiconductor device, comprising:

forming a preliminary active channel pattern on a substrate, the preliminary active channel pattern including a plurality of gate layers and a plurality of single crystalline silicon layers that are alternately stacked;

forming an isolation layer pattern spaced apart from both sidewalls of the preliminary active channel pattern on the substrate;

forming a hard mask on the preliminary active channel pattern;

etching the preliminary active channel pattern using the hard mask as an etching mask until a surface of the substrate is exposed to form an active channel pattern including gate patterns and single crystalline silicon patterns;

growing silicon from sidewalls of the active channel pattern to form source/drain layers;

forming mask pattern structures having gate trenches on the active channel pattern and the source/drain layers;

selectively etching the gate patterns to form a plurality of tunnels;

filling the tunnels and the gate trenches between the mask pattern structures with a gate electrode, the gate electrode surrounding the active channel pattern and having a protruded portion protruding from a surface of the active channel pattern; and implanting impurities into the source/drain layers to form source/drain regions.

18. The method of claim 17, wherein forming the gate electrode comprises:

forming a gate dielectric layer on a bottom face of the gate trenches and a substantially entire face of the tunnels between the mask pattern structures;

forming a first conductive layer on the mask pattern structures and the gate dielectric layer so as to fill up the tunnels;

forming a second conductive layer on the first conductive layer; and chemically mechanically polishing the second conductive layer until surfaces of the mask pattern structures are exposed to form the gate electrode in the gate trenches.

19. The method of claim 18, after forming the gate electrode, further comprising:

partially etching upper portions of the second conductive layer and the first conductive layer in the gate electrode;

filling the etched upper portions of the gate electrode with a silicon nitride layer; and chemically mechanically polishing the silicon nitride layer until the mask pattern structures are exposed to form a capping layer pattern on the etched upper portions of the gate electrode.

20. The method of claim 17, wherein forming the metal silicide layer comprises:

forming a cobalt layer on an upper face and a sidewall of the gate electrode, and an upper face of the source/drain layer;

reacting the cobalt layer with the source/drain layers to form a cobalt silicide layer; and removing a non-reacting portion of the cobalt layer.

* * * * *